United States Patent [19]

Lee et al.

[11] Patent Number: 5,233,206

[45] Date of Patent: Aug. 3, 1993

[54] DOUBLE DIGITLINES FOR MULTIPLE PROGRAMMING OF PROM APPLICATIONS AND OTHER ANTI-FUSE CIRCUIT ELEMENT APPLICATIONS

[75] Inventors: Roger R. Lee; Tyler A. Lowrey; D. Mark Durcan, all of Boise, Id.

[73] Assignee: Micron Technology, Inc., Boise, Id.

[21] Appl. No.: 791,808

[22] Filed: Nov. 13, 1991

[51] Int. Cl.$^5$ .................. H01L 27/020; H01L 27/112; G11C 11/340

[52] U.S. Cl. .................................... 257/50; 257/530; 365/225.7

[58] Field of Search ................. 257/50, 163, 298, 530, 257/306, 532; 365/163, 225.7; 437/47, 48, 52, 53, 59

[56] References Cited

U.S. PATENT DOCUMENTS

| | | | |
|---|---|---|---|
| 4,981,810 | 1/1991 | Fazan et al. | 437/52 |
| 5,053,351 | 10/1991 | Fazan et al. | 437/47 |
| 5,084,406 | 1/1992 | Rhodes et al. | 437/48 |
| 5,126,290 | 6/1992 | Lowrey et al. | 437/235 |

Primary Examiner—Rolf Hille
Assistant Examiner—David B. Hardy
Attorney, Agent, or Firm—David J. Paul

[57] ABSTRACT

The present invention provides a programmable structure for programmable integrated circuits, such as programmable read-only memory (PROM) which utilizes one-sided ozone spacers constructed on the digitlines as well as on the wordlines thereby providing two, one time programmable nodes at each digit/word/digit' intersection. An oxide/nitride/oxide layer (ONO) is used as an interface between underlying parallel rows of digit lines, having one-sided ozone spacers, and overlying parallel columns of word lines, also having one-sided ozone spacers, and further overlying parallel rows' of digitlines' in a programmable read only memory. With a lower level of digitlines passing under a middle level of wordlines and an upper level of digitlines' passing over the middle level of wordlines, a row/column/digit' matrix is formed thereby providing a programmable row/column/row' matrix in a memory array. Each crossing point of the digit/word lines and the word/digit' lines in the matrix will be permanently programmed to either a one or a zero by rupturing the thin ONO dielectric interface by applying the appropriate voltage potential between the associated digit/-word/digit' line conductors.

13 Claims, 3 Drawing Sheets

DOUBLE DIGITLINES FOR MULTIPLE PROGRAMMING OF PROM APPLICATIONS AND OTHER ANTI-FUSE CIRCUIT ELEMENT APPLICATIONS

FIELD OF THE INVENTION

This invention relates to the field of semiconductor devices. More specifically, a process is described which allows multiple programming of non-volatile memory devices by utilizing one-sided ozone spacers constructed on double digit lines as programmable nodes.

BACKGROUND OF THE INVENTION

A read only memory (PROM) consists of an array of semiconductor devices (diodes, bipolar or field-effect transistors) which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit which is expensive and feasible only when a large quantity of the same data array is required.

EPROMs use a special charge-storage mechanism to enable or disable the switching elements in the memory array. In this case, appropriate voltage pulses to store electrical charges at the memory array locations is provided. The data stored in this manner is generally permanent until it is erased using ultraviolet light allowing it to once again be programmed.

PROMs (being the focus of the present invention) are typically manufactured with all switching elements present in the array, with the connection at each row-column intersection being made by means of a fusible link. In order to store data in the PROM, these fusible links are selectively blown using appropriate voltage pulses supplied by a PROM programmer. Once the links are blown, the data is permanently stored in the memory array.

Copending application, Ser. No. 760,026, by Tyler A. Lowrey and Ruojia Lee, discloses a one-sided TEOS spacer constructed on digitlines that provides one time programming of the data memory array using an antifuse element. The one-sided TEOS spacer digitline concept, taught in application Ser. No. 760,026, is further developed in the present invention.

SUMMARY OF THE INVENTION

The present invention creates a unique double digitline matrix (digit/word/digit' matrix) that allows multiple programming, at each double row-column (or row/-column/row') intersection of the data memory array, by using anti-fuse elements as programming nodes.

The digit/word/digit' matrix of the present invention may be easily employed during the fabrication of an integrated circuit which currently may use one time programming. Specifically, the programmable digit/-word/digit' matrix utilizes one-sided ozone spacers constructed on both the digitlines (or rows) and wordlines (or columns) as programmable nodes at each point of intersection between digit/word (row/column) and word/digit' (or column/row'). Due to the cross-hatching network of the double digitlines each node may be programmed more than once.

The present invention focuses on integrating the programmable double digitline matrix specifically into a PROM but it will be obvious to one skilled in the art to implement this approach into other programmable integrated circuits, such as programmable logic arrays (PLAs), programmable array logic (PALs) and the like or simply logic circuits in general.

BRIEF DESCRIPTION OF THE DRAWINGS

FIG. 2a is a cross-sectional view taken perpendicular to the patterned double digitlines (digit and digit') and parallel to a wordline sandwiched in between;

DETAILED DESCRIPTION OF THE PREFERRED EMBODIMENT

Figure 2A:
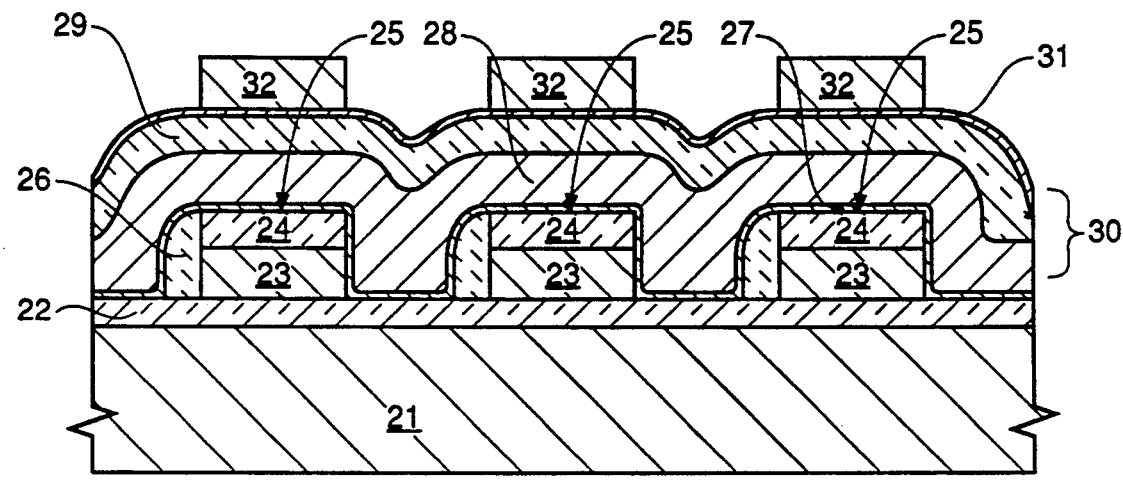
Figure 2B:
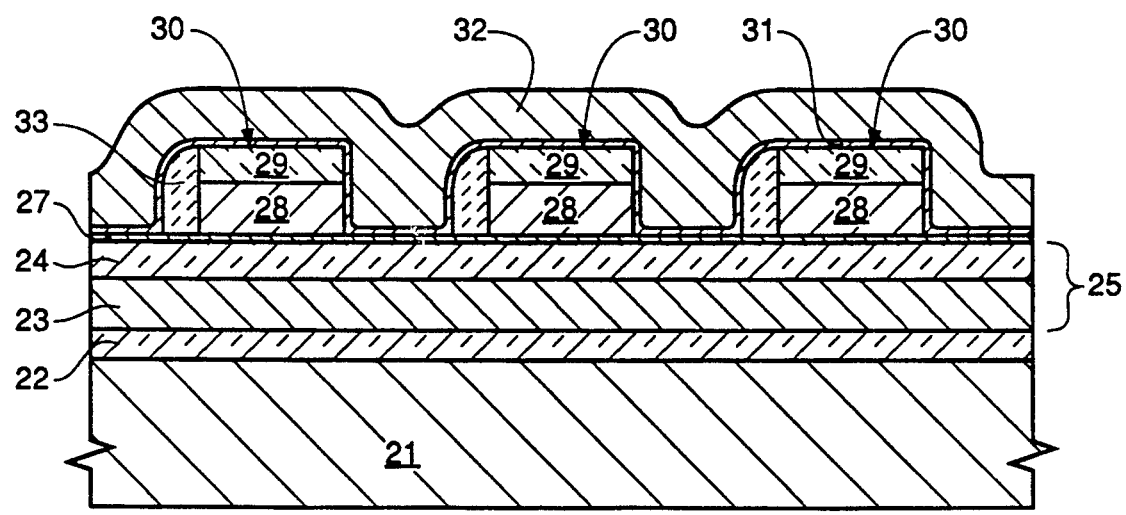
FIG. 2b is a cross-sectional view taken perpendicular to the patterned wordlines sandwiched between the double digitlines (digit and digit')

To enable one skilled in the art to manufacture the double digitline programmable structure of FIGS. 2a and 2b, copending application Ser. No. 760,026, by Tyler A. Lowrey and Ruojia Lee, herein incorporated by reference, teaches how to fabricate a conductor having a one-sided ozone spacer. It will become obvious for one skilled in the art to use existing fabrication techniques to construct the double digitline depicted in FIGS. 2a and 2b once these figures are observed in conjunction with copending application Ser. No. 760,026. Discussion of the present invention will now follow.

Figure 1A:
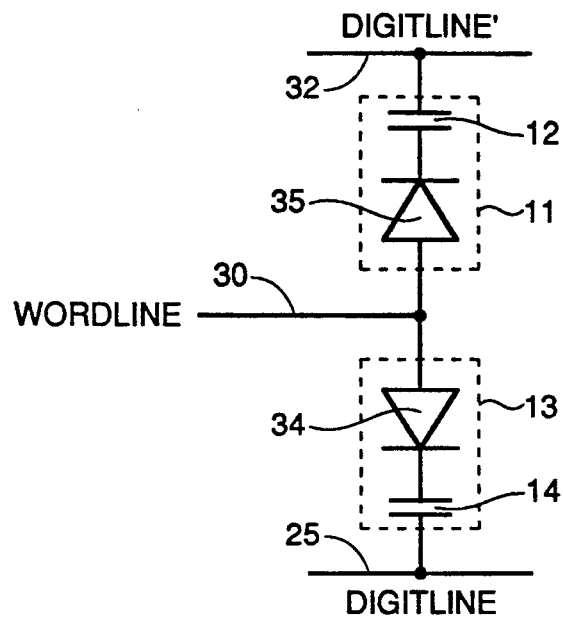
FIG. 1a shows a schematical representation of the present invention depicting non-programmed antifuse elements.
Figure 1B:
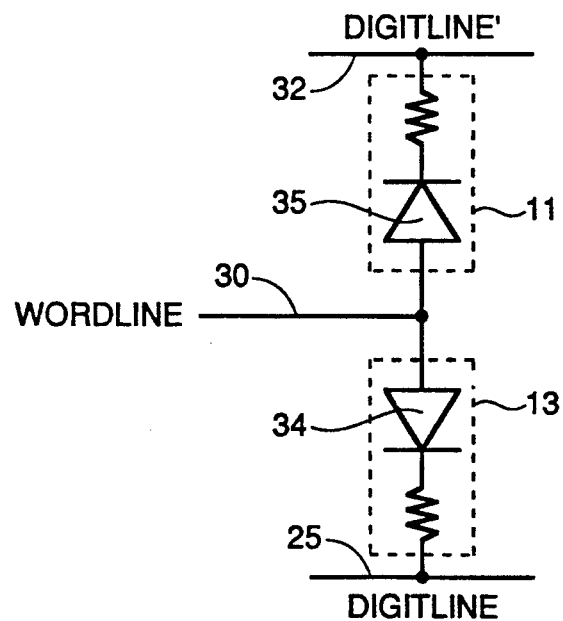
FIG. 1b shows a schematical representation of the present invention depicting programmed antifuse elements.

FIG. 1a, depicts a schematical representation of the present invention showing wordline 30 connected to two unprogrammed antifuse elements, first antifuse element 11 comprising diode 35 connected to wordline 30 and isolation element 12 connected between diode 35 and digitline' 32. Second antifuse element 13 comprises diode 34 connected to wordline 30 (and diode 35) and isolation element 14 connected between diode 34 and digitline 25.

To serve as an example, this embodiment refers specifically to applying the present invention to a PROM, however it will become obvious that this concept may be applied to the fabrication of many integrated circuits, such as PLA's, PAL's or any basic logic circuitry that could utilize the present invention.

A wafer is processed up to the point prior to fabricating the digitlines of a PROM memory array by using conventional process steps. The formation of the programmable digit/word/digit' matrix is illustrated in FIG. 2a.

Referring now to FIG. 2a, silicon substrate 21 has been covered by a thick dielectric layer 22, such as oxide or nitride. Rows of parallel digitlines 25 are then patterned and etched out of layers of n-type conductively doped polysilicon 23 and oxide 24. Next oxide spacers 26 are formed on both sides of digitlines 25. Although any oxide would serve as digit lines spacers, it is preferred to form spacers 26 out of ozone using a TEOS source gas. Every other oxide spacer 26 has been removed from parallel digitlines 25. Next, a thin antifuse dielectric layer 27, formed out of thermal oxidation and/or depositions of oxide, nitride and oxide respectively (otherwise known as ONO), blankets the existing wafer surface. Dielectric layer 27 allows one time programming between digitlines 25 and wordlines 30.

Referring to FIG. 2b, conductive parallel wordlines 30 are fabricated in the same manner as were parallel digitlines 25 discussed previously except that wordlines 30 are patterned in an angular fashion (usually perpendicular) to digitlines 25. Wordlines 30 are comprised of p-type conductively doped poly 28 overlaid by thick oxide 28, with thick oxide spacers 33 formed on every other wordline and then blanketed by dielectric 31 (ONO is also preferred).

Finally, a second set of n-type conductively doped parallel digitlines' 32 (running perpendicular to cross-sectional view 3a and parallel with cross-sectional view 3b) are patterned to overlie wordlines 30 in an angular or perpendicular fashion. Dielectric layer 31 allows one time programming between digitlines' 32 and wordlines 30. Conventional fabrication continues to complete the PROM die.

The programmable digit/word/digit' matrix is now complete with the first set of digitlines passing under the wordlines and the second set of digitlines passing over the wordlines in a row/column/row' matrix. Each crossing point of the digit, word and digit' lines in the matrix is associated with a specific memory address. Dielectric 27, between digitlines 25 and wordlines 30, presents a thin dielectric interface between digitline polysilicon 23 and wordline polysilicon 28, while dielectric 31, between wordlines 30 and digitlines' 32, presents a thin dielectric interface between digitlines' polysilicon 32 and wordline polysilicon 28. These thin dielectric interfaces now allow for each intersection point between each row (digitline 25) and column (wordline 30) and/or each column (wordline 30) and row' (digitline' 32) to be permanently programmed to either a one or a zero. It is important to note that any two adjacent antifuse structures are separated by the normal digitline or wordline spacing. This spacing prevents the possibility of the depletion regions for two adjacent antifuse structures from touching each other and thereby avoid leakage from one structure to another. In addition, the vertical height of digitline polysilicon 23 and wordline polysilicon 28 become the controlling lithography resolution dimension, rather than the horizontal width of a conventional structure used to form a programmed pn diode.

Figure 3A:
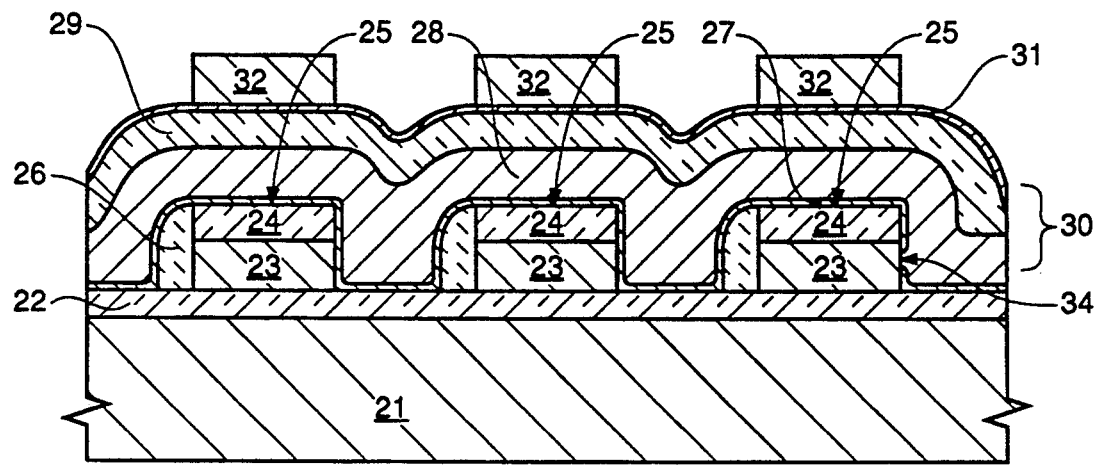
FIG. 3a shows a cross-sectional view in respect to FIG. 2a showing the antifuse dielectric has been ruptured at a word/digit line intersection after programming.

Programming the row/column/row' matrix is performed in the same way conventional PROMs are programmed. As shown in FIG. 3a, a one is desired to be programmed at a certain memory address location between a row and a column. To accomplish this, a positive voltage (usually 10–12 V) is applied to the wordline poly 28 (usually p-type poly), while 0 V is applied to the digitline poly 23 (usually n-type poly) intersecting at the desired memory address location. (For sake of reference the location being programmed is referred to as intersection 34). This applied positive voltage forward biases the pn junction and is great enough to rupture the dielectric 27 interface. Once dielectric 27 ruptures, wordline poly 28 and digitline poly 23 fuse together to form a pn diode at junction 34 which intercouples the digit/word intersection. If a zero is desired at a certain memory address location, there is no difference of potential applied at that intersection or the pn junction is simply reversed biased, thus leaving the antifuse dielectric 27 interface intact. Once the row/column matrix is programmed, conventional sense amplifiers detect if current is present (a pn diode is present, thus a one is detected) or not (no pn diode present, thus a zero is detected).

Figure 3B:
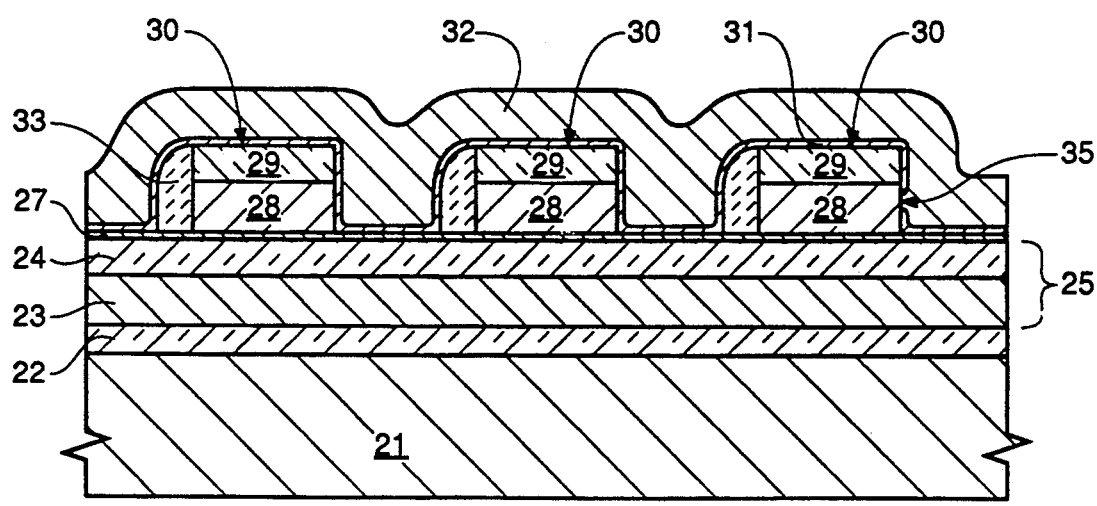
FIG. 3b shows a cross-sectional view in respect to FIG. 2a showing the antifuse dielectric has been ruptured at a word/digit' line intersection after programming.

The procedure is the same as described above to program a column/row' intersection, except that the programming voltage is applied between digitline' poly 32 and wordline poly 28. As shown in FIG. 3b, a pn diode is formed at junction 35 once this intersection is programmed, thereby intercoupling the word/digit' intersection.

Implementing the digit/word/digit' matrix allows multiple programming at a specified location in many applications, such as providing a backup memory to the original programmed memory array, or adding an additional memory array thereby doubling the memory size of a given storage array, or for programming logic circuitry. In order to utilize the additional programmed memory, controlling logic would need added, such as in the periphery of a PROM IC, as determined by one skilled in the art to meet the desired use of the present invention.

It is to be understood that although the present invention has been described with reference to a preferred embodiment, various modifications known to those skilled in the art, such as reversing the conductivity type of the digit, word and digit' lines, may be made to the structures presented herein without departing from the invention as recited in the several claims appended hereto.

We claim:

1. A programmable structure having first and second one-time programmable nodes in an integrated circuit comprising:
    a) a patterned first conductor having an overlying patterned first dielectric;
    b) a second dielectric adjacent the patterned sides of said first conductor and said first dielectric, said second dielectric being a first thick dielectric spacer on a first patterned side of said first conductor and said first dielectric;
    c) a third dielectric layer blanketing said first thick dielectric spacer, said first dielectric and a second patterned side of said first conductor and said first dielectric;
    d) a patterned second conductor overlying said first conductor, said second conductor having an overlying patterned fourth dielectric residing in intersecting angular fashion to said first conductor with said third dielectric being a first programmable interface therebetween, thereby forming said first programmable node;
    e) a fifth dielectric adjacent the patterned sides of said fifth conductor and said fourth dielectric, said second dielectric being a second thick dielectric spacer on a first patterned side of said second conductor and said fourth dielectric;

f) a sixth dielectric ;layer blanketing said second thick dielectric spacer, said fourth dielectric and a second patterned side of said second conductor and said fifth dielectric; and g) a patterned third conductor overlying said second patterned conductor, said third conductor residing in intersecting angular fashion to said second conductor with said sixth dielectric being a second interface therebetween, thereby forming said second programmable node.

2. The programmable structure of claim 1 wherein said first programmable node is programmed by rupturing said third dielectric by applying a voltage potential between said first and said second conductors thereby producing an intercoupling pn junction therebetween and said second programmable node is programmed by rupturing said sixth dielectric by applying a voltage potential between said second and said third conductors thereby producing an intercoupling pn junction therebetween.

3. The programmable structure of claim 1 wherein said integrated circuit comprises a memory device.

4. The integrated circuit of claim 3 wherein said memory device comprises a programmable read only memory.

5. The integrated circuit of claim 3 wherein said memory device comprises a programmable logic array.

6. The integrated circuit of claim 3 wherein said memory device comprises programmable array logic.

7. The integrated circuit of claim 1 wherein said programmable structure is formed on a substrate comprising silicon.

8. The integrated circuit of claim 1 wherein said first, second, fourth and fifth dielectric layers comprise oxide.

9. The integrated circuit of claim 1 wherein said third and sixth dielectric layers comprise oxide/nitride/oxide.

10. The programmable structure of claim 1 wherein said second and fifth dielectric spacers comprise ozone.

11. The integrated circuit of claim 1 wherein said first, second and third conductors comprise doped polysilicon.

12. The integrated circuit of claim 11 wherein said said first and third polysilicon conductor doping is to an n-type conductivity and said second polysilicon conductor doping is to a p-type conductivity.

13. The integrated circuit of claim 11 wherein said said first and third polysilicon conductor doping is to a p-type conductivity and said second polysilicon conductor doping is to an n-type conductivity.

* * * * *